(12) United States Patent
Bour et al.

(10) Patent No.: US 7,180,923 B2
(45) Date of Patent: Feb. 20, 2007

(54) LASER EMPLOYING A ZINC-DOPED TUNNEL-JUNCTION

(75) Inventors: David Bour, Cupertino, CA (US);
Chaokun Lin, Fremont, CA (US);
Michael Tan, Menlo Park, CA (US);
Bill Perez, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 371 days.

(21) Appl. No.: 10/367,200

(22) Filed: Feb. 13, 2003

(65) Prior Publication Data
US 2004/0161013 A1     Aug. 19, 2004

(51) Int. Cl.
*H01S 5/00* (2006.01)
(52) U.S. Cl. ............... 372/43.01; 372/92; 372/96; 372/50.1
(58) Field of Classification Search .......... 372/96, 372/92, 99, 43–50, 75, 50.1
See application file for complete search history.

(56) References Cited

U.S. PATENT DOCUMENTS

| | | | | |
|---|---|---|---|---|
| 5,528,071 A | * | 6/1996 | Russell et al. | 257/458 |
| 5,800,630 A | | 9/1998 | Vilela et al. | |
| 5,805,624 A | * | 9/1998 | Yang et al. | 372/45 |
| 5,818,863 A | * | 10/1998 | Nabet et al. | 372/46 |
| 6,010,937 A | * | 1/2000 | Karam et al. | 438/363 |
| 6,052,398 A | * | 4/2000 | Brillouet et al. | 372/46 |
| 6,653,158 B2 | * | 11/2003 | Hall et al. | 438/22 |

FOREIGN PATENT DOCUMENTS

| | | |
|---|---|---|
| JP | 09 055522 A | 2/1997 |
| WO | WO 98/56084 | 12/1998 |

OTHER PUBLICATIONS

Takamoto T. et al., "Radiation Resistance of High-Efficiency InGaP/GaAs Tandem Solar Cells", Solar Energy Materials and Solar Cells, vol. 58, No. 3, Jul. 15, 1999, pp. 265-276.
Patent Abstracts of Japan, Feb. 25, 1997, Japan.
Applied Physics Letters—vol. 76, #16—pp. 2179-2181—M. Ortsiefer, et al—Low-Threshold index guided 1.5 μm long-wavelength vertical-cavity surface-emitting laser with high efficiency.
European Patent Office—CF Form 1507—Jun. 28, 2006.

* cited by examiner

*Primary Examiner*—Minsun Oh Harvey
*Assistant Examiner*—Delma R. Flores Ruiz

(57) ABSTRACT

An improved tunnel junction structure and a VCSEL that uses this structure is disclosed. The tunnel junction includes first, second, and third layers that include materials of the InP family of materials. The first layer is doped with n-type dopant species to a concentration of $10^{19}$ dopant atoms per $cm^3$ or greater. The second layer is doped with Zn to a similar concentration and is in contact with the first layer. The interface between the first and second layers forms a tunnel junction. The third layer includes a material that retards the diffusion of Zn out of the second layer. The third layer preferably includes undoped AlInAs. The tunnel junction structure of the present invention can be utilized in a VCSEL having an active layer between first and second mirrors that are both constructed from n-type semiconductor layers.

12 Claims, 2 Drawing Sheets

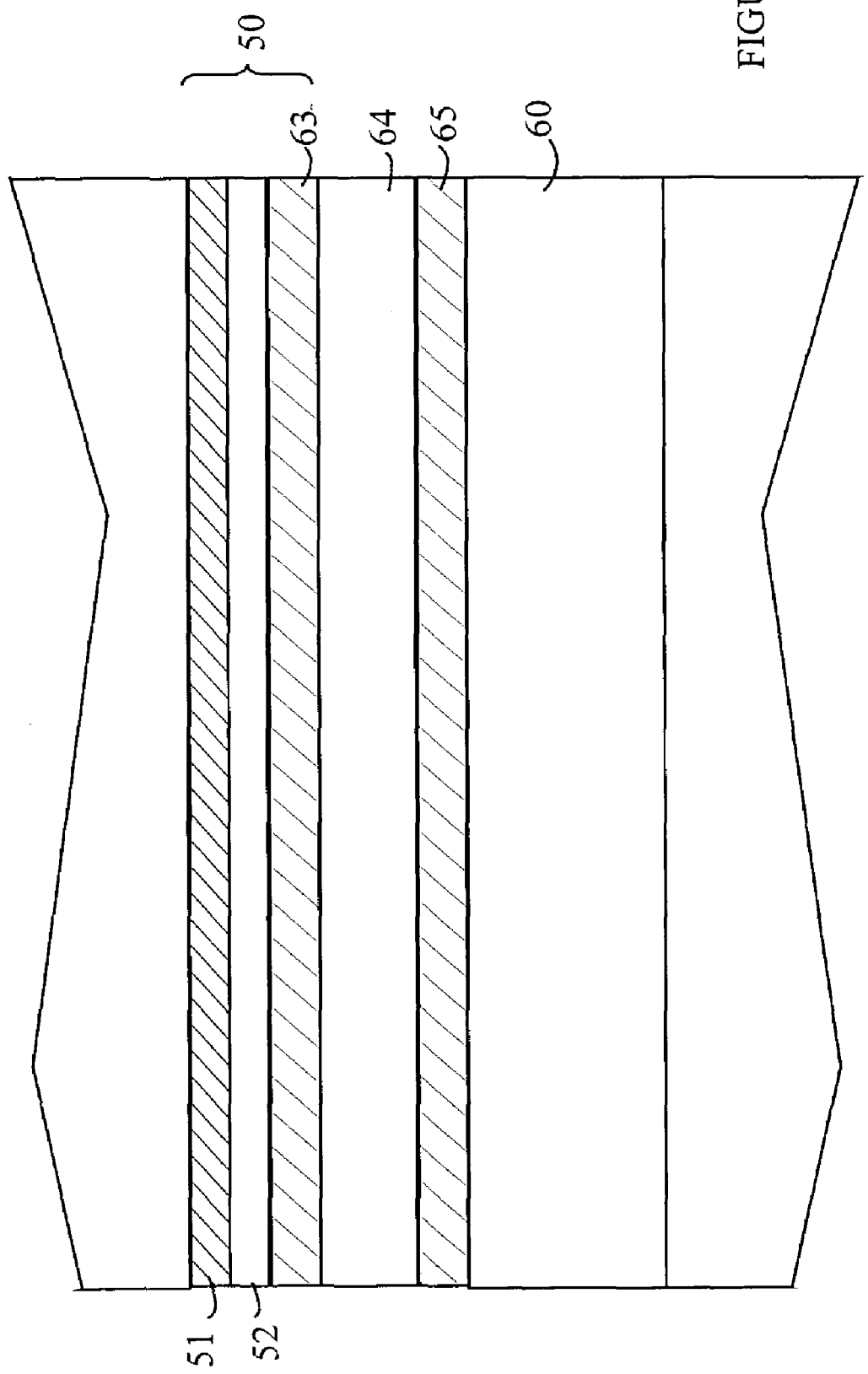

LASER EMPLOYING A ZINC-DOPED TUNNEL-JUNCTION

FIELD OF THE INVENTION

The present invention relates to tunnel junction structures and semiconductor lasers using tunnel junction structures.

BACKGROUND OF THE INVENTION

Currently, nearly all commercially available VCSELs used for fiber communication are 850-nm AlGaAs-based devices. However, the capacity and reach of these networks would be improved by using long-wavelength VCSELs (1300 and 1550 nm) constructed from InP-based materials. However, construction of VCSELs that emit at these longer wavelengths is hampered by the absorption of the generated light, particularly in the p-type material layers of the VCSEL.

A conventional VCSEL is a p-i-n diode structure having DBR mirrors above and below the active region. The top mirrors are constructed from a large number of layers of p-type material in which the index of refraction of the layers alternates between two values. The bottom mirror is similarly constructed from a large number of layers of an n-type material in which the index of refraction of the layers alternates between two values. The mirrors define the laser cavity that is roughly one half p-type semiconductor material. At long wavelengths, the p-type material absorption is significant, and hence, designs in which the amount of p-type material, through which the light must pass, is substantially reduced are needed.

SUMMARY OF THE INVENTION

The present invention is an improved tunnel junction structure and a VCSEL that uses this structure. The tunnel junction includes first, second, and third layers that include materials of the InP family of materials. The first layer is doped with an n-type dopant species to a concentration of $10^{19}$ dopant atoms per $cm^3$ or greater. The second layer is doped with Zn to a concentration of $10^{19}$ dopant atoms per $cm^3$ or greater and is in contact with the first layer. The interface between the first and second layers forms a tunnel junction. The third layer includes a material that retards the diffusion of Zn out of the second layer. The third layer preferably includes undoped AlInAs. The tunnel junction structure of the present invention can be utilized in a VCSEL having an active layer between the first and second mirrors that are both constructed from n-type semiconductor layers. The tunnel junction of the present invention is placed between one of the mirrors and a p-type layer that is connected to the active region. The second layer is preferably located at a null of the standing electromagnetic wave in the laser cavity formed by the first and second mirrors.

BRIEF DESCRIPTION OF THE DRAWINGS

FIG. 2 is a cross-sectional view of the layers in the vicinity of the active layer in a VCSEL according to the present invention.

DETAILED DESCRIPTION OF THE PREFERRED EMBODIMENTS OF THE INVENTION

Figure 1:
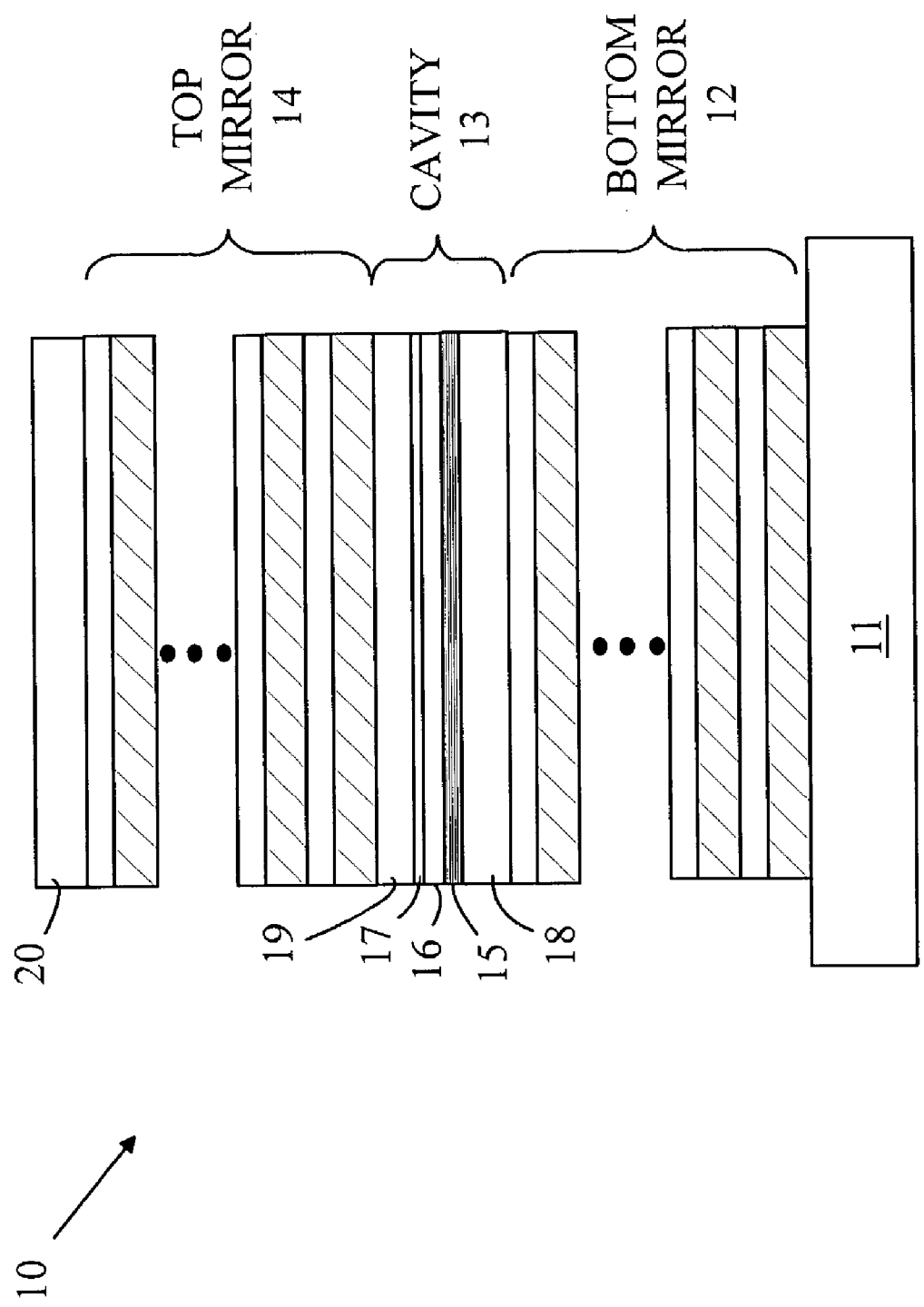
FIG. 1 is a cross-sectional view of the layers of a VCSEL 10 according to one embodiment of the present invention.

The manner in which the present invention provides its advantages can be more easily understood with reference to FIG. 1, which is a cross-sectional view of the layers of a VCSEL 10 according to one embodiment of the present invention. VCSEL 10 is constructed on a substrate 11, which, in the present embodiment includes any contact layers needed to supply power to the bottom side of the active region. VCSEL 10 includes a bottom mirror 12, an optical cavity 13, and a top mirror 14. The mirrors are conventional DBR mirrors, and hence, will not be described in detail here. As noted above, the mirrors are constructed by growing alternating layers of material in which the adjacent layers have different indices of refraction. It should be noted, however, that in the present invention, both the bottom and top mirrors are constructed from n-type material to reduce the amount of p-type material through which the light must pass.

The use of n-type mirrors and contact layers also improves the current spreading function of the mirrors. The laser is powered by applying a potential across the mirrors, and hence, across the active layer. Power is provided to the top mirror via an electrical contact structure 20 that includes an electrode and contact layer. The electrode in contact layer 20 must include a window through which the light exits. Hence, the electrode does not cover the entire mirror layer. Accordingly, the current must spread out from this limited electrode area through the contact layer to cover the active region of the laser. P-type materials have higher resistivities, and hence, perform this spreading function less effectively than n-type layers. In addition, the higher resistivities of the p-type layer result in more power being consumed in ohmic heating.

The laser cavity includes an active region 15 constructed from quantum well layers separated by barrier layers in the conventional manner. The layer 18 under the active layer is an n-type layer; whereas, the layer 16 on top of the active layer is a very thin p-type layer that provides the p-i-n structure. An n-p tunnel junction 17 allows current to flow to the p-type layer from the top n-type layers in spite of the reverse-biased nature of the junction. Layers 18 and 19 may be viewed as "spacer" layers whose thickness is chosen to provide the correct resonant wavelength for the cavity. In addition, these spacer layers position the tunnel junction 17 and the quantum well layers at the desired locations within the optical cavity as will be discussed in more detail below.

The various layers discussed above are preferably constructed from materials from the InP family. For the purposes of this discussion, a material will be defined to be in the InP family if it includes In and its lattice constant is within one percent of that of InP. Specific examples of such materials are InP, AlGaInP, InGaAsP, and AlGaInAs.

The use of a tunnel junction to reduce the amount of p-type material by allowing both mirrors to be constructed from n-type material depends on being able to provide a tunnel junction that contributes only a few tenths of a volt to the overall diode potential, when the current density is at a typical operating value of ~5–10 $kA/cm^2$. As noted above, the tunnel junction is reverse biased during the operation of the VCSEL. Current moves across such a junction by tunneling; however, a potential difference is still required across the junction. Hence, the potential across the VCSEL must be increased to provide the required current through the tunneling junction.

To provide adequate tunneling, the layers of the tunnel junction must be very heavily doped, i.e., dopant concentrations of $10^{19}$ dopant atoms per $cm^3$ or higher are required for both the n- and p-type impurities, on opposite sides of the tunnel junction. Unfortunately, dopant distributions at these high concentrations are often unstable because the impurities diffuse into the neighboring layers. The diffusion reduces the concentration in the highly doped region and can cause problems in the regions to which the dopant atoms migrate. In general, the stability of the dopant atoms depends on the dopant species, the material composition, and the temperature exposure the sample experiences after the dopant is put in place.

It would be advantageous to construct the tunnel junction structure utilizing the common acceptor, zinc, because very high p-doping levels can be achieved with zinc acceptors. Unfortunately, zinc tends to diffuse rapidly in InP. The present invention provides a structure that stabilizes the zinc distribution, and hence, enables the use of zinc as the doping agent for the p-type layer of the tunnel junction in an InP based VCSEL.

Refer now to FIG. 2, which is a cross-sectional view of the layers in the vicinity of the active layer 60 in a VCSEL according to the present invention. The tunnel junction structure comprising the highly-doped tunnel junction layers is shown at 50 and includes a highly doped n-type layer 51 and a highly doped p-type layer 52. The preferred n-type layer is InP, AlGaInAs, or InGaAsP that is doped with Se, S, Si or Te donors to a concentration of $10^{19}$ dopant atoms per $cm^3$ or greater. The p++ layer 52 in one preferred embodiment is InGaAs doped with zinc to a concentration of $10^{19}$ dopant atoms per $cm^3$ or greater.

To prevent the Zn from diffusing into the p-type layers above active region 60, a barrier layer 63 is included in the tunnel junction structure. Barrier layer 63 is preferably constructed from undoped AlInAs that is deposited below p-layer 52. A more lightly doped p-type layer 64 and another undoped layer 65 of AlInAs are deposited over active region 60. The second undoped layer 65 of AlInAs retards the migration of the Zn, used to dope layer 64, out of layer 64. It should be noted that the InP:Se in the n-type layer 51 of the tunnel junction structure 50 prevents Zn from diffusing into the n-type layer. Hence, the high concentration of Zn in the tunnel junction layers is maintained by preventing the Zn from diffusing into the neighboring layers.

The effectiveness of a material that is to be used as a zinc diffusion barrier depends on the zinc diffusivity of the material, the solubility of Zn in the material, and the concentrations of the other impurities in the barrier layer. Low diffusivity and high solubility contribute to suppression of Zn diffusion. It has been found experimentally that layers as thin as 25 nm of undoped AlInAs are effective in blocking movement of the zinc. With this thin AlInAs:un layer included in the tunnel junction, the additional voltage needed to drive the VCSEL was less than 1V, at a current density of 1 kA/$cm^2$. In general, the zinc diffusion barrier layer must be thick enough to absorb the zinc that diffuses out of the tunnel junction layer. Layers as thin as 1 nm may be advantageously utilized. In addition, the thickness has to be less than that thickness that would require a significant potential difference to drive the required current through the layer. While the AlInAs:un layer is not doped when it is deposited, the zinc that diffuses into the layer is sufficient to increase the conductivity of the layer to the point that it does not have a significant voltage drop across the layer.

As noted above, VCSEL 10 includes spacer layers 18 and 19. The thicknesses of the spacer layers are adjusted to provide the proper cavity length for the wavelength of light being generated in the VCSEL. In addition, the relative thickness of the spacer layers with respect to one another is adjusted to position the quantum well layers and the p++ layer of the tunnel junction at the correct points in the cavity relative to the electrical field in the cavity. The quantum well layers are preferably positioned at a maximum of the standing wave in the cavity.

The p++ layer of the tunnel junction is preferably positioned at a null of the standing wave in the cavity. As noted above, p-type InP has a strong free-carrier absorption spectrum at the wavelengths of interest. This is particularly true of the highly doped p++ layer. Hence, the p++ layer 52 is preferably placed at a null of the standing wave to minimize the absorption of the light by this layer.

Various modifications to the present invention will become apparent to those skilled in the art from the foregoing description and accompanying drawings. Accordingly, the present invention is to be limited solely by the scope of the following claims.

What is claimed is:

1. A tunnel junction structure comprising: a first layer comprising a material of the InP family of materials, said first layer being doped with n-type dopant species to a concentration of $10^{19}$ dopant atoms per $cm_3$ or greater a second layer comprising a material of the InP family of materials that is doped with Zn to a concentration of $10^{19}$ dopant atoms per $cm^3$ or greater in contact with said first layer; and a third layer comprising a material of the InP family of materials for retarding the diffusion of Zn out of said second layer, wherein said first and second layer are directly adjacent to one another and form a tunnel junction and wherein said second layer id between said first and third layers.

2. The tunnel junction structure of claim 1 wherein said second layer comprises InGaAs.

3. The tunnel junction strucure of claim 1 wherein said third layer comprises AlInAs.

4. The tunnel junction structure of claim 1 wherein said first layer comprises a material chosen from the group consisting of InP, AlGaInAs, and InGaAsP.

5. The tunnel junction structure of claim 1 wherein said n-type dopant species comprises an element chosen from the group cosisting of Se, S, Si, and Te.

6. A laser comprising: a first mirror comprising a plurality of layers of an n-type semiconductor; an active region comprising a quantum well layer, said active layer generating light by the recombination of holes and electrons therein; a first layer of a p-type semiconductor comprising a material of the InP family of materials; a barrier layer comprising a material of the InP family of materials, said barrier layer impeding the migration of Zn atoms into said first p-type layer; a first tunnel junction layer comprising a material of the InP family of materials doped with Zn to a concentration $10^{19}$ Zn atoms per $cm^3$ or greater, wherein said first and second tunnel junction layers are directly adjacent to one another and form a tunnel junction; a second tunnel junction layer comprising a material of the InP family of materials doped with an n-type dopant to a concentration of $10^{19}$ dopant atoms per $cm^3$ or greater; a top mirror comprising a plurality of layers of an n-type semiconductor, wherein said barrier layer lies between said first tunnel junction layer and said first layer of p-type semiconductor and wherein said tunnel junction and said active region lies between said top and bottom mirrors.

7. The laser of claim 6 wherein said active layer comprises a material from the InP family of materials.

8. The laser of claim 6 wherein said barrier layer comprises InAlAs.

9. The laser of claim 6 wherein said second tunnel junction layer comprises a material chosen from the group consisting of InP, AlGaInAs, and InGaAsP.

10. The laser of claim 6 wherein said n-type dopant comprises an element chosen from the group consisting of Se, S, Si, and Te.

11. The laser of claim 6 wherein said top and bottom mirrors from a cavity having a standing electromagnetic wave and wherein said first tunnel junction layer is located at a null of said standing wave.

12. The laser of claim 11 wherein said active region is located at a point of maximum electric field of said standing wave.

* * * * *